United States Patent
Gauthier, Jr. et al.

(10) Patent No.: US 9,058,995 B2
(45) Date of Patent: Jun. 16, 2015

(54) SELF-PROTECTED DRAIN-EXTENDED METAL-OXIDE-SEMICONDUCTOR TRANSISTOR

(75) Inventors: Robert J. Gauthier, Jr., Hinesburg, VT (US); Junjun Li, Williston, VT (US); Alain Loiseau, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 512 days.

(21) Appl. No.: 13/440,514

(22) Filed: Apr. 5, 2012

(65) Prior Publication Data
US 2013/0264608 A1   Oct. 10, 2013

(51) Int. Cl.
| | |
|---|---|
| *H01L 21/00* | (2006.01) |
| *H01L 29/66* | (2006.01) |
| *H01L 27/02* | (2006.01) |
| *H01L 29/74* | (2006.01) |
| *H01L 29/45* | (2006.01) |
| *H01L 29/78* | (2006.01) |
| *H01L 29/06* | (2006.01) |

(52) U.S. Cl.
CPC ............ *H01L 27/027* (2013.01); *H01L 29/456* (2013.01); *H01L 29/7436* (2013.01); *H01L 29/7824* (2013.01); *H01L 29/7835* (2013.01); *H01L 29/0692* (2013.01)

(58) Field of Classification Search
CPC ............... H01L 29/7395; H01L 27/24; H01L 29/66477; H01L 27/088; H01L 29/00; H01L 21/3105
USPC ............. 257/133, E29.002, E21.409, E27.06, 257/798, 286; 438/798
See application file for complete search history.

(56) References Cited

U.S. PATENT DOCUMENTS

| | | |
|---|---|---|
| 5,907,462 A | 5/1999 | Chatterjee et al. |
| 6,605,844 B2 | 8/2003 | Nakamura et al. |
| 6,614,077 B2 | 9/2003 | Nakamura et al. |
| 6,617,077 B1 | 9/2003 | Ichihashi et al. |
| 7,835,890 B2 * | 11/2010 | Wu et al. ............... 703/2 |
| 7,915,676 B2 | 3/2011 | Jensen et al. |
| 7,994,579 B2 | 8/2011 | Itai |
| 2009/0267147 A1 | 10/2009 | De Boet et al. |

(Continued)

OTHER PUBLICATIONS

Boselli, et al., "Investigations on Double-Diffused MOS (DMOS) transistors under ESD zap conditions", EOS/ESD Symosium 1999.

(Continued)

*Primary Examiner* — Fernando L Toledo
*Assistant Examiner* — Neil Prasad
(74) *Attorney, Agent, or Firm* — Wood, Herron & Evans, LLP; Anthony J. Canale

(57) ABSTRACT

Device structures, design structures, and fabrication methods for a drain-extended metal-oxide-semiconductor (DEMOS) transistor. A first well of a first conductivity type and a second well of a second conductivity type are formed in a device region. The first and second wells are juxtaposed to define a p-n junction. A first doped region of the first conductivity type and a doped region of the second conductivity type are in the first well. The first doped region of the first conductivity type is separated from the second well by a first portion of the first well. The doped region of the second conductivity type is separated from the second well by a second portion of the first well. A second doped region of the first conductivity type, which is in the second well, is separated by a portion of the second well from the first and second portions of the first well.

20 Claims, 7 Drawing Sheets

(56) References Cited

U.S. PATENT DOCUMENTS

| | | | |
|---|---|---|---|
| 2010/0244106 A1* | 9/2010 | Parker et al. | 257/288 |
| 2010/0301388 A1 | 12/2010 | Lin et al. | |
| 2010/0315159 A1* | 12/2010 | Kocon et al. | 327/564 |
| 2011/0241069 A1 | 10/2011 | Vashchenko | |

OTHER PUBLICATIONS

Chen, et al., "Circuit and Layout Co-Design for ESD Protection in Bipolar-CMOS-DMOS (BCD) High-Voltage Process", IEEE Transactions on Circuits and Systems-I: Regular Papers, vol. 57, No. 5, May 2010.

Duvvury, et al., "Lateral DMOS Design for ESD Robustness", 1997 IEEE.

Kunz et al. "5-V Tolerant Fail-Safe ESD Solutions for .018um Logic CMOS Process", copyright 2001 by ESD Association.

Mergens, et al., "Analysis of Lateral DMOS Power Devices Under ESD Stress Conditions", IEEE Transactions on Electron Devices, vol. 47, No. 11, Nov. 2000.

Wang, et al., "ESD Protection Design with Lateral DMOS Transistor in 40-V BCD Technology", IEEE Transactions on Electron Devices, vol. 57, No. 12, Dec. 2010.

* cited by examiner

SELF-PROTECTED DRAIN-EXTENDED METAL-OXIDE-SEMICONDUCTOR TRANSISTOR

BACKGROUND

The present invention relates to semiconductor device fabrication and, more specifically, to drain extended metal-oxide-semiconductor (DEMOS) transistors, design structures for DEMOS transistors, and methods of fabricating DEMOS transistors.

DEMOS transistors are high-voltage devices that differ both functionally and structurally from low-voltage devices. DEMOS transistors are utilized in an integrated circuit to switch voltages on a chip that are higher than typical logic voltages. DEMOS transistors feature a depleted drift region in series with a transistor drain so that a portion of the switched voltage is dropped across the drift region to protect the transistor gate dielectric. This structural modification reduces the electric field at the drain-side edge of the gate dielectric and thereby permits a DEMOS transistor to reliably switch comparatively high voltages without resorting to a thickened gate dielectric to avoid breakdown.

DEMOS transistors also present a high output impedance, which makes DEMOS transistors attractive for switching comparatively high voltages at input/output (I/O) terminals or pins in high frequency applications, such as RF-CMOS chip designs. Unfortunately, DEMOS transistors lack robustness when exposed to electrostatic discharge (ESD) events.

Improved device structures, fabrication methods, and design structures are needed for the ESD protection devices used to protect DEMOS transistors from damage during an ESD event.

SUMMARY

According to one embodiment of the present invention, a device structure includes a first well of a first conductivity type and a second well of a second conductivity type in a device region. The first and second wells are juxtaposed in the device region to define a p-n junction. A first doped region of the first conductivity type and a first doped region of the second conductivity type are in the first well. The first doped region of the first conductivity type is separated from the second well by a first portion of the first well. The first doped region of the second conductivity type is separated from the second well by a second portion of the first well. A second doped region of the first conductivity type, which is in the second well, is separated from the first and second portions of the first well by a portion of the second well.

According to another embodiment of the present invention, a method is provided for fabricating a device structure. The method includes forming a first well of a first conductivity type in a device region and forming a second well of a second conductivity type in the device region. The first and second wells are juxtaposed to define a p-n junction. The method further includes forming a first doped region of the first conductivity type in the first well, forming a second doped region of the first conductivity type in the second well, and forming a first doped region of the second conductivity type in the first well. The first doped region of the first conductivity type is separated from the second well by a first portion of the first well. The first doped region of the second conductivity type is separated from the second well by a second portion of the first well. The second doped region of the first conductivity type is separated from the first and second portions of the first well by a portion of the second well.

According to another embodiment of the present invention, a design structure is provided that is readable by a machine used in design, manufacture, or simulation of an integrated circuit. The design structure includes a first well of a first conductivity type and a second well of a second conductivity type in a device region. The first and second wells are juxtaposed to define a p-n junction. A first doped region of the first conductivity type and a first doped region of the second conductivity type are in the first well. The first doped region of the first conductivity type is separated from the second well by a first portion of the first well. The first doped region of the second conductivity type in the first well is separated from the second well by a second portion of the first well. A second doped region of the first conductivity type is in the second well. The second doped region of the first conductivity type is separated from the first and second portions of the first well by a portion of the second well. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
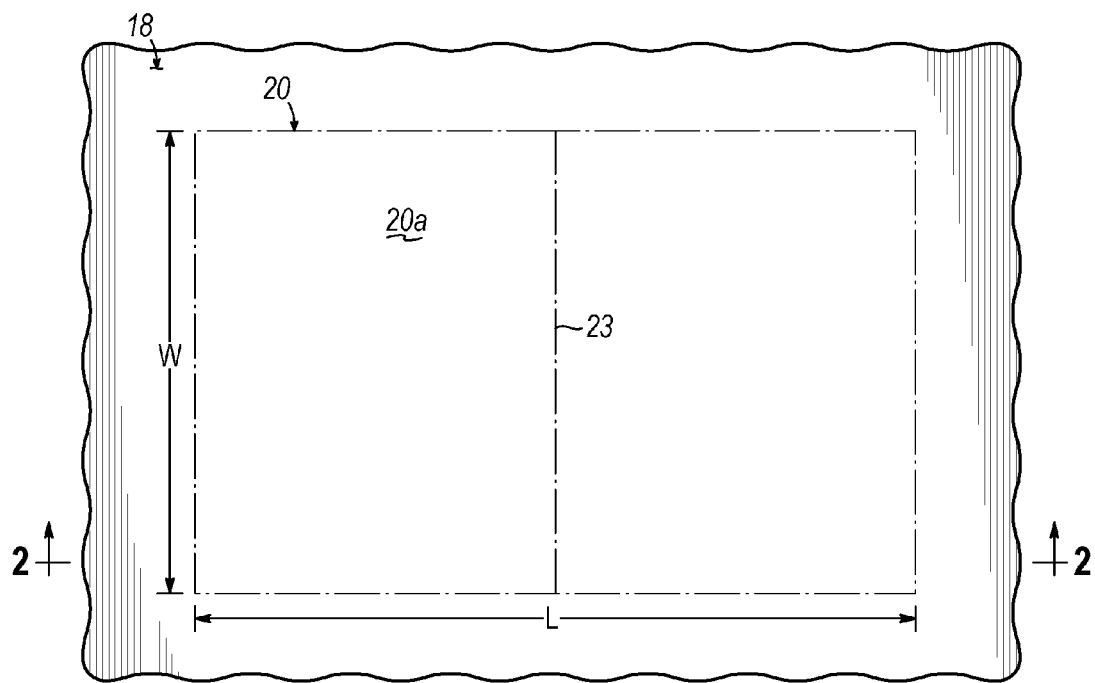
FIG. 1 is a top view of a portion of a substrate at an initial fabrication stage of a processing method for forming a self-protected DEMOS transistor in accordance with an embodiment of the invention.
Figure 2:
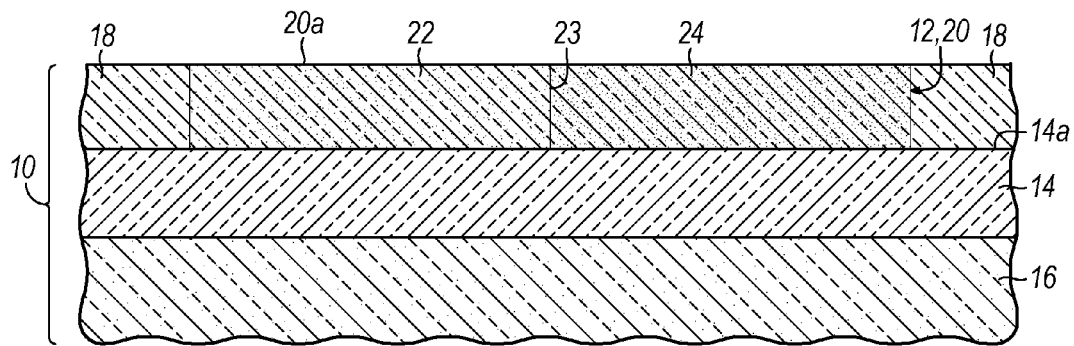
FIG. 2 is a cross-sectional view taken generally along line 2-2 in FIG. 1.

With reference to FIGS. 1, 2 and in accordance with an embodiment of the invention, a semiconductor-on-insulator (SOI) substrate 10 includes a device layer 12, a buried insulator layer 14, and a handle wafer 16. The device layer 12 is separated from the handle wafer 16 by the intervening buried insulator layer 16 and is in direct contact along a planar interface with a top surface 14a of the buried insulator layer 14. The buried insulator layer 14 electrically insulates the handle wafer 16 from the device layer 12, which is considerably thinner than the handle wafer 16. The buried insulator layer 14 may be comprised of an electrical insulator and, in particular, may be comprised of silicon dioxide (e.g., $SiO_2$) to constitute a buried oxide layer.

The device layer 12 and handle wafer 16 may be comprised of a monocrystalline semiconductor material, such as single crystal silicon or another crystalline semiconductor material that contains primarily silicon, and the semiconductor material of the device layer 12 may be device quality. The device layer 12 may have a thickness measured from its top surface 12a to a top surface 14a of the buried insulator layer 14 ranging from two (2) nm to 150 nm. The SOI substrate 10 may be fabricated by any suitable conventional technique, such as wafer bonding techniques or separation by implantation of oxygen (SIMOX) techniques, familiar to a person having ordinary skill in the art.

Trench isolation regions 18 circumscribe and electrically isolate a device region 20. A top surface 20a of the device region 20 is nominally co-planar with a top surface of the trench isolation regions 18. The device region 20 has a width, W, and a length, L, defined by the locations of the trench isolation regions 18. As a result, the top surface 20a has a surface area with a perimeter bounded by the trench isolation regions 18.

The trench isolation regions 18 may be isolation structures formed by a shallow trench isolation (STI) technique that relies on lithography and dry etching processes to define trenches that terminate at the top surface 14a of the buried insulator layer 14, deposits an electrical insulator to fill the trenches, and planarizes the electrical insulator relative to the top surface of the device layer 12 using a chemical mechanical polishing (CMP) process. The trench isolation regions 18 may be comprised of a dielectric material, such as an oxide of silicon and, in particular, densified tetraethylorthosilicate (TEOS) deposited by chemical vapor deposition (CVD).

Wells 22, 24 may be formed as doped regions in the device region 20 and are comprised of semiconductor material from the device layer 12. In the representative embodiment, the wells 22, 24 are juxtaposed with each other and are localized in the device region 20. The wells 22, 24 may be comprised of lightly-doped semiconductor material of opposite conductivity types and are butted along a p-n junction 23 across which the conductivity type changes.

Each of the wells 22, 24 may be formed by implanting ions of an impurity species into the device region 20 through its top surface 20a in the presence of a patterned mask applied to the top surface of the device layer 12. Each mask controls dopant introduction into device region 20 during implantation by stopping the implanted ions within its thickness so that the device layer 12 is selectively implanted with the impurity species to respectively form the wells 22, 24. Each mask may be a photoresist layer having a window aligned with the intended location of one of the wells 22, 24 and formed in the mask using a photolithographic patterning process. The implantation conditions (e.g., kinetic energy and dose) are selected to form each of the wells 22, 24 with a desired doping concentration (e.g., light doping). After ion implantation is complete, each mask is removed by, for example, oxygen plasma ashing or wet chemical stripping.

In a representative embodiment, the well 22 may be a lightly-doped n-well with the constituent semiconductor material having an n-type conductivity supplied by implanting ions of an impurity species from Group V of the Periodic Table (e.g., phosphorus (P), arsenic (As), or antimony (Sb)) and the well 24 may be a lightly-doped p-well with the constituent semiconductor material having a p-type conductivity supplied by implanting ions of an impurity species from Group III of the Periodic Table (e.g., boron (B), aluminum (Al), gallium (Ga), or indium (In)).

As used herein, the dopant concentration in semiconductor material that is considered heavily doped may be at least an order of magnitude higher than the dopant concentration in semiconductor material that is considered lightly doped. The relative dopant concentrations for heavily-doped semiconductor material and lightly-doped semiconductor material are understood by a person having ordinary skill in the art. For example, a representative dopant concentration for heavily-doped semiconductor material may be greater than or equal to $10^{18}$ $cm^{-3}$, and a representative dopant concentration for lightly-doped semiconductor material may be less than or equal to $10^{16}$ $cm^{-3}$.

Figure 3:
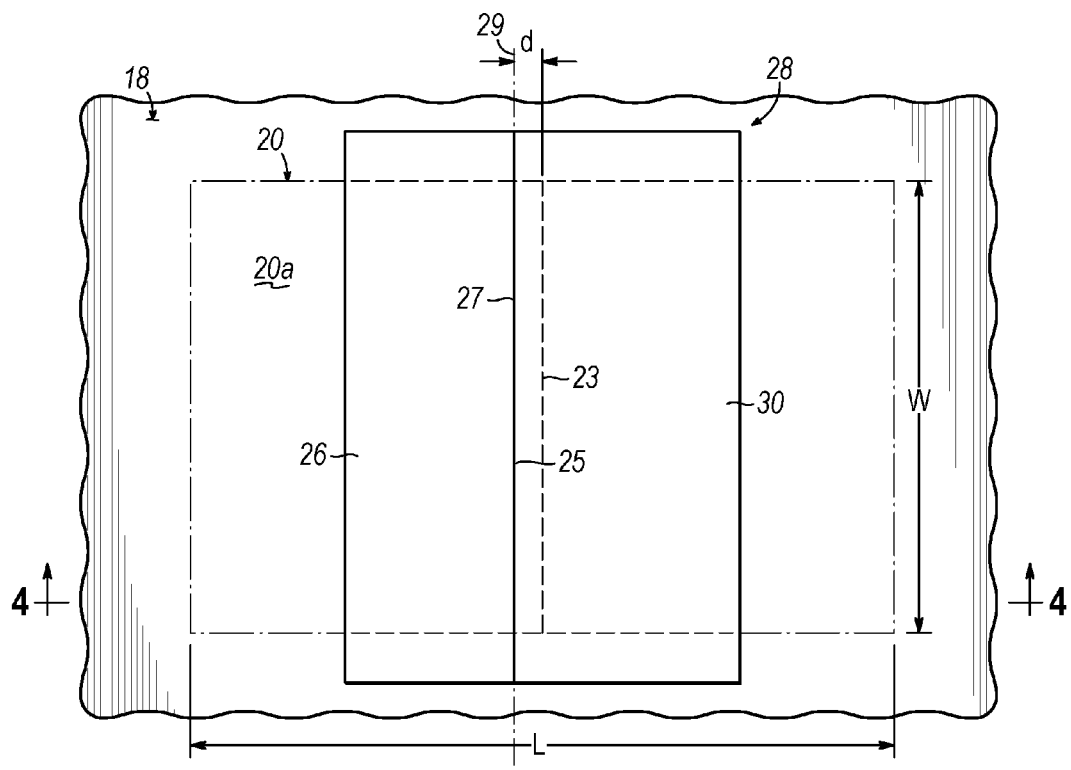
FIG. 3 is a top view similar to FIG. 1 at a fabrication stage of the processing method subsequent to FIG. 1.
Figure 4:
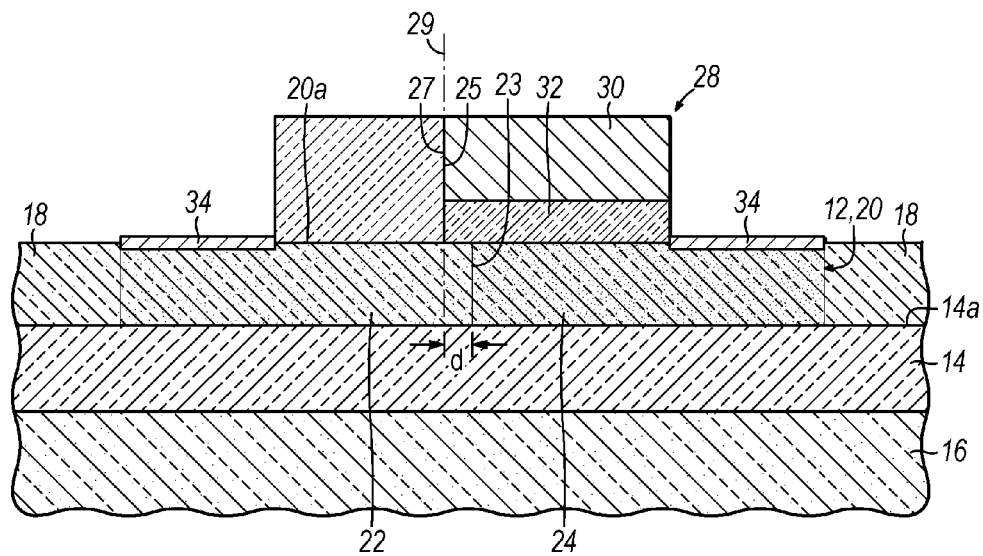
FIG. 4 is a cross-sectional view taken generally along line 4-4 in FIG. 3.

With reference to FIGS. 3, 4 in which like reference numerals refer to like features in FIGS. 1, 2 and at a subsequent fabrication stage, a mask feature 26 and a gate stack, which is generally indicated by reference numeral 28, are formed with a juxtaposed spatial relationship on the top surface 20a of the device region 20. One of the sidewalls 25 of the mask feature 26 abuts and is coextensive with one of the sidewalls 27 of the gate stack 28 along a boundary 29. Alternatively, the mask feature 26 may overlap with the gate stack 28 so that a portion of the mask feature 26 other than the sidewall 25 is coextensive with one of the sidewalls 27 of the gate stack 28 along boundary 29. The boundary 29 may be a plane that is aligned normal to the top surface 20a of the device region 20.

The gate stack 28 includes a gate electrode 30 and a gate dielectric layer 32 positioned between the gate electrode 30 and the top surface 20a of the device region 20. The gate stack 28 overlaps the p-n junction 23 between the wells 22, 24 so that the boundary 29 is shifted laterally by a distance, d, relative to the p-n junction 23. As a result, the p-n junction 23 is located in the device region 20 beneath the gate stack 28 and is displaced inward from the nearest neighbor sidewall 27 of the gate stack 28. The misalignment of the boundary 29 with the p-n junction 23 likewise causes well 22 to partially extend beneath the gate stack 28 so that the mask feature 26 overlaps a portion of the well 22 and the gate stack 28 overlaps a different portion of the well 22.

The mask feature 26 may be comprised of a non-conductive dielectric material that is an electrical insulator and, in particular, may be comprised of a silicide blocking (sblk) material, such as a nitride, oxide, or oxynitride of silicon deposited by CVD or PVD, that is used in a CMOS process to block silicide formation. The mask feature 26 may be patterned from a layer of the non-conductive dielectric material using photolithography and etching processes. To that end, the layer of the non-conductive dielectric material is deposited on the top surface 20a and a sacrificial layer is subsequently applied. The sacrificial layer may be comprised of a photoresist that is applied as a layer by a spin coating process, pre-baked, exposed to a radiation projected through a photomask, baked after exposure, and developed with a chemical developer to form an etch mask that includes a feature coinciding with the intended location of mask feature 26. The feature is transferred from the sacrificial layer by the etching process to the layer to define the boundaries of the mask feature 26. The etching process may comprise a dry etching process, such as reactive-ion etching (RIE) that produces vertical sidewalls 27. The etching process, which may be conducted in a single etching step or multiple steps, relies on one or more etch chemistries and may comprise a timed etch or an end-pointed etch. The sacrificial layer is removed in response to forming the mask feature 26. If comprised of a photoresist, the sacrificial layer may be removed by ashing or solvent stripping, followed by surface cleaning.

The gate stack 28 may be patterned from a layer stack comprised of the constituent materials of the gate electrode 30 and gate dielectric layer 32 using photolithography and etching processes. To that end, the layer stack is formed on the top surface 20a and a sacrificial layer is subsequently applied. The sacrificial layer may be comprised of a photoresist that is applied as a layer by a spin coating process, pre-baked, exposed to a radiation projected through a photomask, baked after exposure, and developed with a chemical developer to form an etch mask that includes a feature coinciding with the intended location of gate stack 28. The feature is transferred from the sacrificial layer by the etching process to the layer stack to define the boundaries of the gate stack 28. The etching process may comprise a dry etching process, such as reactive-ion etching (RIE) that produces vertical sidewalls 27. The etching process, which may be conducted in a single etching step or multiple steps, relies on one or more etch chemistries and may comprise a timed etch or an end-pointed etch. The sacrificial layer is removed in response to forming the gate stack 28. If comprised of a photoresist, the sacrificial layer may be removed by ashing or solvent stripping, followed by surface cleaning.

The gate dielectric layer 32 may be comprised of an electrically-insulating material (e.g., a non-conductor). In one embodiment, the gate dielectric layer 32 may be comprised of an oxide of silicon such as silicon oxide (e.g., $SiO_2$) grown by wet or dry thermal oxidation. In another embodiment, the gate dielectric layer 32 may include one or more layers of an electrical insulator having a dielectric constant (e.g., a permittivity) characteristic of a high-k dielectric having a dielectric constant greater than 10 and, preferably, in a range of 10 to 100. In yet another embodiment, the gate dielectric layer may include a dual layer film, such as an interfacial layer comprised of a material (e.g., $SiO_2$) with a dielectric constant less than 10 and an additive layer comprised of a high-k dielectric material. Candidate high-k dielectric materials include, but are not limited to, hafnium-based dielectric materials like hafnium oxide ($HfO_2$), hafnium silicate (HfSiO), aluminum oxide ($Al_2O_3$), lanthanum oxide ($La_2O_3$), titanium dioxide ($TiO_2$), tantalum oxide ($Ta_2O_5$), zirconium oxide ($ZrO_2$), zirconium silicon oxide (ZrSiO), yttrium oxide ($Y_2O_3$), strontium oxide (SrO), or strontium titanium oxide (SrTiO), mixtures thereof, or layered stacks of these and other dielectric materials. The dielectric materials may be deposited by, for example, atomic layer deposition (ALD) or chemical vapor deposition (CVD). The gate dielectric layer 32 may be comprised of a material, such as silicon oxynitride (SiON) or a nitrided hafnium silicate (HfSiON), that includes nitrogen introduced by plasma nitridation.

The gate electrode 30 may include one or more layers comprised of a conductor, such as doped polycrystalline silicon (polysilicon) and/or a metal. In various embodiments, the gate electrode 30 may be comprised of one or more metals such as tungsten (W), tantalum (Ta), titanium nitride (TiN), zirconium nitride (ZrN), hafnium nitride (HfN), vanadium nitride (VN), niobium nitride (NbN), tantalum nitride (TaN), tungsten nitride (WN), titanium aluminum nitride (TiAlN), tantalum carbide (TaC), tantalum magnesium carbide (TaMgC), tantalum carbonitride (TaCN), a combination or an alloy thereof, a combination with doped polysilicon, or similar materials recognized by a person having ordinary skill in the art. The gate electrode 30 may be deposited by, for example, CVD, ALD, or physical vapor deposition (PVD).

The gate stack 28 may be formed in the process flow of the fabrication process either before or after the mask feature 26. In a representative embodiment, the gate stack 28 is formed in the process flow before the mask feature 26.

A silicide layer 34 may be formed on regions of the top surface 20a of device region 20 that are not covered by the mask feature 26. Although not illustrated, the silicide layer 34 may also form on the top surface of the gate electrode 30. A silicidation process may be employed to form the silicide layer 34 that involves one or more annealing steps to form a silicide phase from the layer of silicide-forming metal and the material of the device region 20.

Figure 5:
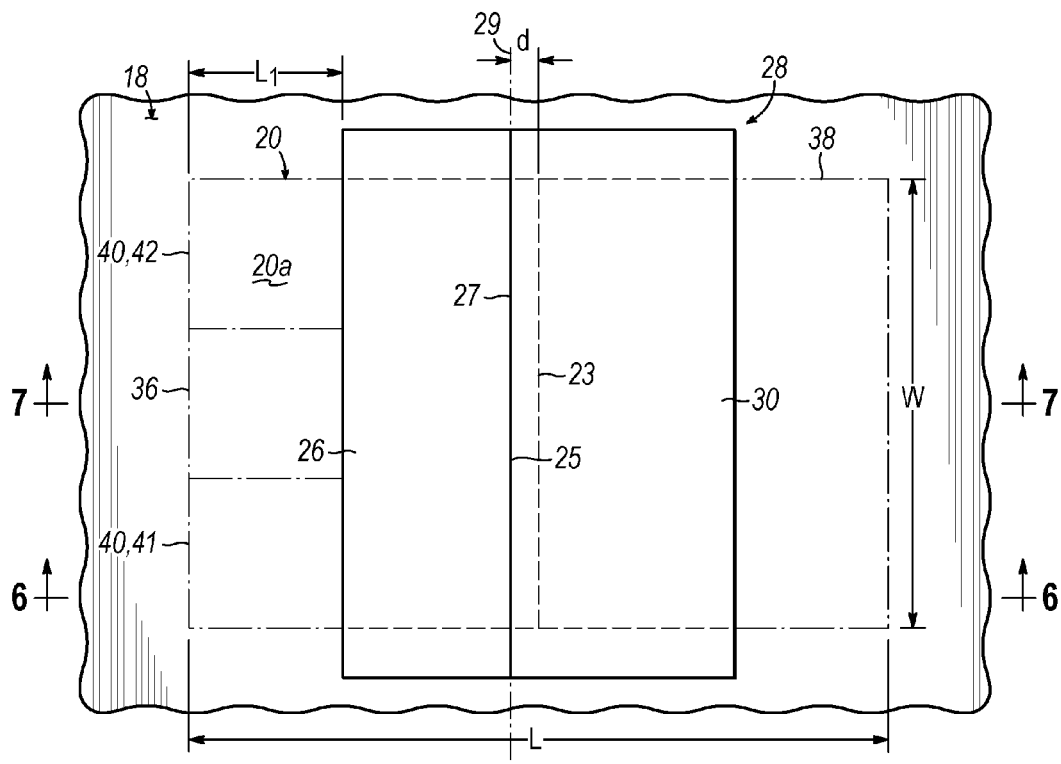
FIG. 5 is a top view similar to FIG. 3 at a fabrication stage of the processing method subsequent to FIG. 3.
Figure 6:
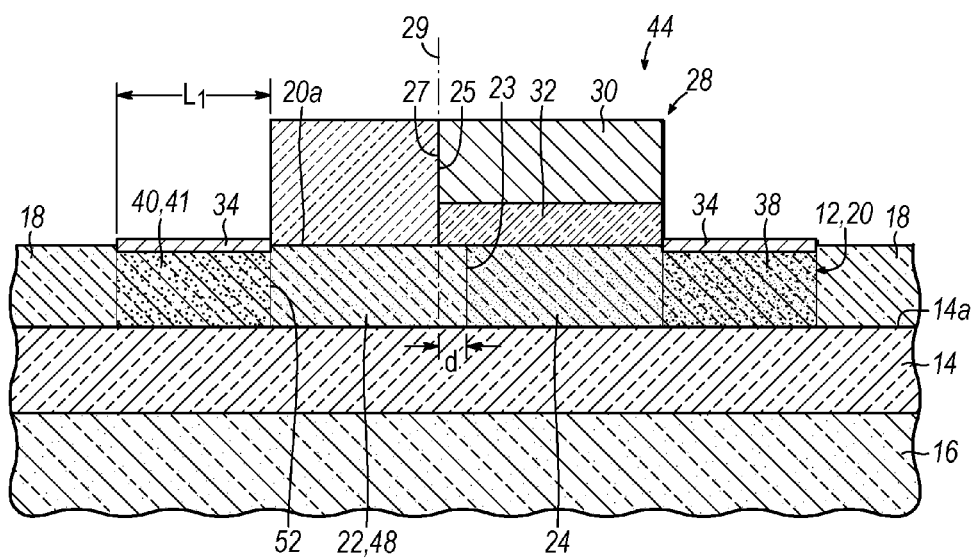
FIG. 6 is a cross-sectional view taken generally along line 6-6 in FIG. 5.
Figure 7:
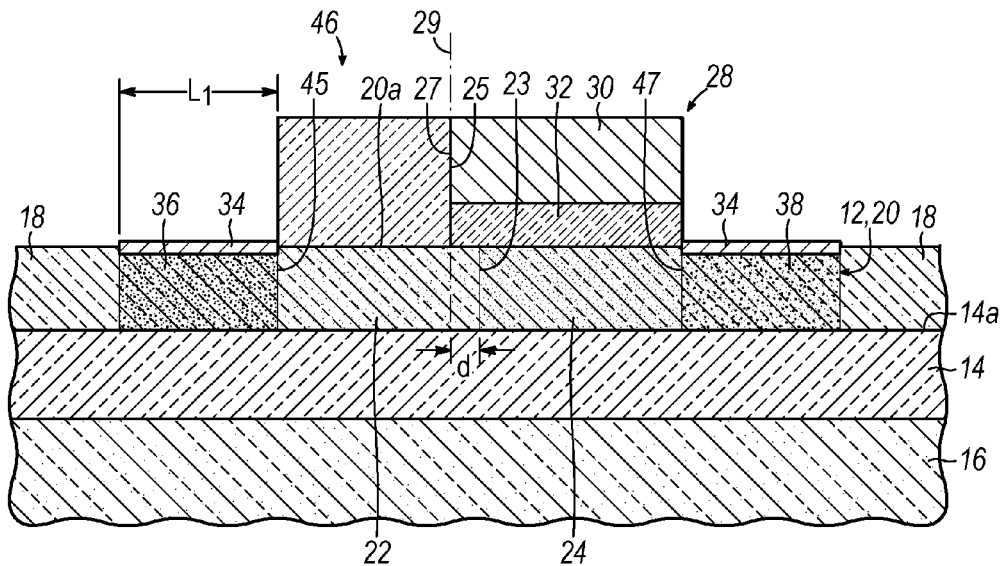
FIG. 7 is a cross-sectional view taken generally along line 7-7 in FIG. 5.

With reference to FIGS. 5-7 in which like reference numerals refer to like features in FIGS. 3, 4 and at a subsequent fabrication stage, doped regions 36, 38, 40 comprised of heavily-doped semiconductor material of the device region 20 are formed at selected locations in sections of the adjacent wells 22, 24. The mask feature 26 and gate stack 28 operate in conjunction with patterned sacrificial layers to self-align the selected locations for the doped regions 36, 38, 40 and to cover the remaining sections of the wells 22, 24 that survive intact in device region 20 after doped regions 36, 38, 40 are formed. The formation of the doped regions 36, 38, 40 reduces the size of the wells 22, 24. Doped regions 36, 38 and doped region 40 are spaced along the length, L, of the device region 20 with the wells 22, 24 as intervening structures. Consequently, doped regions 36, 38 are located in sections of the well 22 on an opposite peripheral edge of the device region 20 from doped region 40, which is located in a section of well 24.

In the representative embodiment, doped region 38 extends for the entire width, W, of the device region 20 and doped region 40 likewise extends for the entire width, W, of the device region 20. However, doped region 40 is segmented into two separate sections 41, 42 from the presence of the doped region 36 of opposite conductivity type. In the representative embodiment, the doped region 36 bisects the doped region 40 so that the sections 41, 42 are equal in size. However, the location of the doped region 36 may be shifted along the width, W, of the device region 20 so that the sections 41, 42 are unequal in size.

Doped region 36 is comprised of semiconductor material having an opposite conductivity type from the semiconductor material of doped regions 38, 40 and is butted with the semiconductor material of doped region 40. Doped region 36, which is laterally disposed within the well 22 of lightly-doped semiconductor material, is comprised of semiconductor material having the opposite conductivity type from well 22. Doped region 40, which is also laterally disposed in the well 22 of lightly-doped semiconductor material, is comprised of semiconductor material having the same conductivity type as well 22 but with a higher doping concentration and thereby a higher electrical conductivity (i.e., lower electrical resistivity). Doped region 38, which is laterally disposed in the well 24 of lightly-doped semiconductor material, is comprised of semiconductor material having the opposite conductivity type from well 24.

The doped region 36 may be formed by implanting ions of an impurity species into the device region 20 through its top surface 20a in the presence of a patterned sacrificial layer applied to the top surface of the device layer 12. The sacrificial layer controls dopant introduction into device region 20 during implantation by stopping the implanted ions within its thickness so that the device region 20 is selectively implanted with the impurity species to form the doped region 36. In particular, the sacrificial layer blocks the dopant from being implanted at the intended locations for doped regions 38, 40.

The mask feature 26 and gate stack 28 cooperate with the sacrificial layer to respectively prevent dopant introduction into the sections of the wells 22, 24 that survive intact the formation of doped regions 36, 38, 40. In addition, one sidewall 25 of the mask feature 26 operates to self-align an interior edge of the doped region 36 relative to well 22 during implantation. The sacrificial layer may be a resist layer having a window aligned with the intended location of the doped region 36 in the device region 20 and formed in the sacrificial layer using a photolithographic patterning process. The implantation conditions (e.g., kinetic energy and dose) are selected to form the doped region 36 with a desired doping concentration (e.g., heavy doping). After ion implantation is complete, the sacrificial layer is removed by, for example, oxygen plasma ashing or wet chemical stripping.

The doped regions 38, 40 may be formed by implanting ions of an impurity species into the device region 20 through its top surface 20a in the presence of a patterned sacrificial layer applied to the top surface of the device layer 12. In the representative embodiment, the doped regions 38, 40 are formed after the doped region 36 is formed. The sacrificial layer controls dopant introduction into device region 20 during implantation by stopping the implanted ions within its thickness so that the device layer 20 is selectively implanted with the impurity species to form the doped regions 38, 40. The sacrificial layer furnishes the segmentation of the doped region 40 into sections 41, 42 by blocking the dopant from being implanted into doped region 36. The sacrificial layer used to form the doped regions 38, 40 may be a resist layer having windows aligned with the intended locations of the doped regions 38, 40 in the device region 20 and formed in the sacrificial layer using a photolithographic patterning process. The implantation conditions (e.g., kinetic energy and dose) are selected to form the doped regions 38, 40 with a desired doping concentration (e.g., heavy doping). After ion implantation is complete, the sacrificial layer is removed by, for example, oxygen plasma ashing or wet chemical stripping.

In a representative embodiment in which well 22 is a lightly-doped n-well and well 24 is a lightly-doped p-well, doped region 36 may be heavily doped to have p-type conductivity and doped regions 38, 40 may be heavily doped to have n-type conductivity. The ion implantation forming doped region 36 introduces a dopant from Group V of the Periodic Table and ion implantation forming doped regions 38, 40 introduces a dopant from Group III of the Periodic Table.

The mask feature 26 and the gate stack 28 cooperate to respectively align the doped regions 38, 40 with the wells 22, 24. Specifically, one sidewall 25 of the mask feature 26 operates to self-align an interior edge of the doped region 40 relative to a portion of well 22 during implantation and represents the same sidewall 25 of the mask feature 26 that self-aligns an interior edge of the doped region 36 relative to well 22. Consequently, the doped region 36 and the doped region 40 have the same dimension, $L_f$, along the length, L, of the device region 20. One sidewall 27 of the gate stack 28 operates to self-align an interior edge of the doped region 38 relative to well 24 during implantation.

The device structure comprises a drain extended MOS (DEMOS) transistor 44 and a silicon controlled rectifier (SCR) 46 that are integral to a single device region 20. Each of the devices in the device structure occupies a portion of the device region and, in particular, the DEMOS transistor 44 and SCR 46 share the wells 22, 24 and doped region 38 as device layers. Similarly, the DEMOS transistor 44 and the SCR 46 share the mask feature 26 and the gate stack 28, which overlie the shared wells 22, 23. The device structure combining the SCR 46 with the DEMOS transistor 44 integrates ESD protection for the DEMOS transistor 44 into a single device region 20 and with sharing of device elements for compactness. The composite device structure increases the robustness to the DEMOS transistor 44 by self-protecting the DEMOS transistor 44 due to the presence of the integrated SCR 46 and alleviates the inherent ESD weakness of the DEMOS transistor 44. The fabrication of the device structure is relatively easy to integrate into CMOS process flows, which promotes its use where logic circuitry or low power analog circuitry is also to be fabricated in a single integrated circuit.

Figure 8:
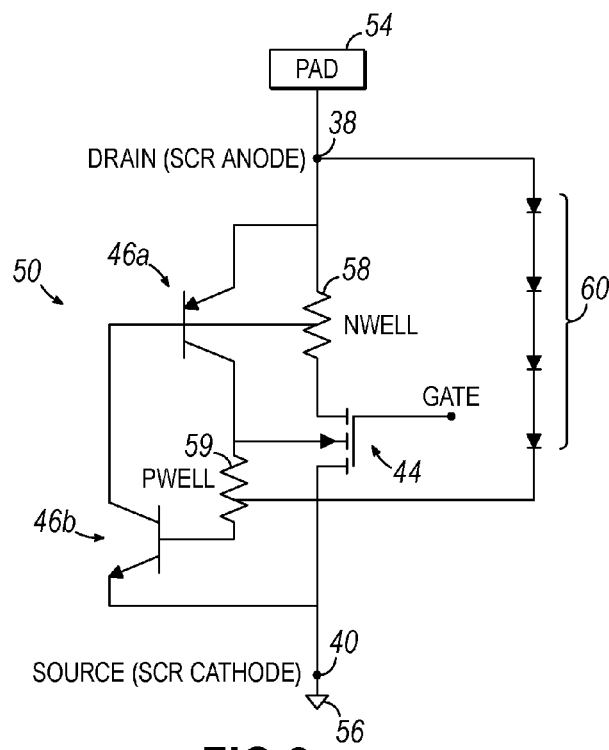
FIG. 8 is a schematic view of an electrical configuration for the device structure of FIGS. 5-7.

The SCR 46 has a lateral device construction that includes doped region 36, well 22, well 24, and doped region 38 as layers of alternating conductivity type. The SCR 46 includes the p-n junction 23 defined by the abutment of wells 22, 24, a p-n junction 45 defined by the abutment of doped region 36 with a portion of well 22, and a p-n junction 47 defined by the abutment of doped region 38 with well 24. The SCR 46 is comprised of cross-coupled parasitic PNP and NPN bipolar transistors 46a, 46b (FIG. 8). The doped region 38 may represent a cathode of the SCR 46, and the doped region 36 may represent an anode of the SCR 46.

The DEMOS transistor 44 likewise has a lateral device construction represented by the two sections 41, 42 of the doped region 40, well 22, well 24, and doped region 38. The drain of the DEMOS transistor 44 is represented by the sections 41, 42 of the doped region 40 and is spaced from the nearest-neighbor sidewall 25 of the gate stack 28 by the well 22, which is overlapped by the mask feature 26. The sections 41, 42 of the doped region 40 are coextensive with respective portions of the well 22 along an interface 52. The source of the DEMOS transistor 44 is represented by the doped region 38 and is positioned closer to the gate electrode 30 and channel than the source in the asymmetrical source-drain arrangement. The channel of the DEMOS transistor 44 is represented by the well 24, which underlies the gate stack 28. The gate stack 28 is used to define the channel by masking the implantation forming the doped region 38. While the portion of the DEMOS transistor 44 that includes section 41 of doped region 40 is illustrated in FIG. 6, the portion of the DEMOS transistor 44 that includes section 42 of doped region 40 is identical in cross section.

The respective portions 51, 52 of the well 22 between the sections 41, 42 of the doped region 40 and the well 24 comprise an extended drain region 48. The mask feature 26 is used to define the extended drain region 48 by masking the implantations forming the doped regions 36, 40. The well 22 and the doped region 40 have a common conductivity type with the doped region 40 having a higher dopant concentration than the well 22 and, therefore, a higher electrical conductivity. Consequently, the extended drain region 48 has a lower electrical conductivity (e.g., higher electrical resistivity) than the doped region 40 representing the drain, which operates to drop the voltage. The DEMOS transistor 44 can operate at higher drain voltages without suffering voltage breakdown failure because the light doping of the extended drain region 48 creates a drift region or voltage drop region between the drain and the channel.

The anode of the SCR 46 represented by doped region 36 and the drain of the DEMOS transistor 44 represented by doped region 40 are aligned along an edge of the well 22. The well 22 functions as an extended drain for the DEMOS transistor 44 and as a layer of the SCR 46. The well 24 functions as the channel of the DEMOS transistor 44 and as a layer of the SCR 46. The doped region 38 functions as the source of the DEMOS transistor 44 and as the cathode of the SCR 46. The SCR 46 protects the DEMOS transistor 44 from ESD events when the DEMOS transistor 44 is the circuit containing the SCR 46 and DEMOS transistor 44 is unpowered, and the DEMOS transistor 44 is operative to provide voltage switching when the circuit containing the SCR 46 and DEMOS transistor 44 is powered.

Due to the arrangement of the wells 22, 24 and doped regions 36, 38, 40, the doped region 36 is distanced along the length, L, of the device region 20 from the doped region 38 to permit formation of the SCR 46, while at the same time the well 22 is also coextensive with the doped region 40. The doped region 36 is not located in the device region between the well 22 and the doped region 38. The p-n junction 45 defined by the abutment of doped region 36 with well 22 and the interface between the doped region 40 and well 22 are equal distances from the junction 23.

With reference to FIG. 8 in which like reference numerals refer to like features in FIGS. 5-7, the SCR 46 may be used as a protection element in an electrostatic discharge (ESD) protection circuit 50 configured to discharge current from an ESD pulse that might otherwise damage the DEMOS transistor 44. Specifically, the doped region 40 defining the drain of the DEMOS transistor 44 and the anode of the SCR 46 may be electrically coupled by a common signal path to an input/output (I/O) pad 54 that receives high voltage signals. The doped region 38 (i.e., the anode of the SCR 46 and the source of the DEMOS transistor 44) may be coupled to the ground buss at a ground pad 56. Wells 22, 24 constitute electrical resistances 58, 59 in the ESD protection circuit 50. The gate (i.e., the well 24) of the PNP bipolar transistor 46a is coupled with a drive circuit 60, which may be a diode string.

In response to the voltage from an ESD pulse, the drive circuit 60 of the ESD protection circuit 50 triggers the SCR 46 to enter a low-impedance conducting state and thereby provide a high-current capacity conduction path for the ESD current from the I/O pad 54 to the ground pad 56. The high-current capacity conduction path includes the doped region 36, the portions of wells 22, 24 between doped regions 36, 38, and doped region 38. The SCR 46 is triggered before the DEMOS transistor 44 when both are subjected to ESD stress, and has a trigger voltage that is lower than the breakdown voltage of the DEMOS transistor 44.

In response to the ESD current flowing through the SCR 46, the bipolar transistors 46a, 46b hold each other in the low-impedance conducting state and the low impedance conductive state persists until the ESD current is drained and the ESD voltage is discharged to an acceptable level. In this manner the DEMOS transistor 44 is protected from damage during the ESD event by the diversion of the ESD current away from the vulnerable DEMOS transistor 44. At the conclusion of the ESD event, SCR 46 reverts to the high-impedance non-conducting state and remains off until a trigger signal is applied in response to a future ESD event.

The SCR 46 presents no significant load during normal operation of the DEMOS transistor 44. When the DEMOS transistor 44 is powered, the SCR 46 will present a high impedance between the I/O pad 54 and the ground buss at ground pad 56 so that signals communicated over the signal path between the I/O pad 54 and the DEMOS transistor 44 is substantially unaffected by the presence of the SCR 46.

Figure 9:
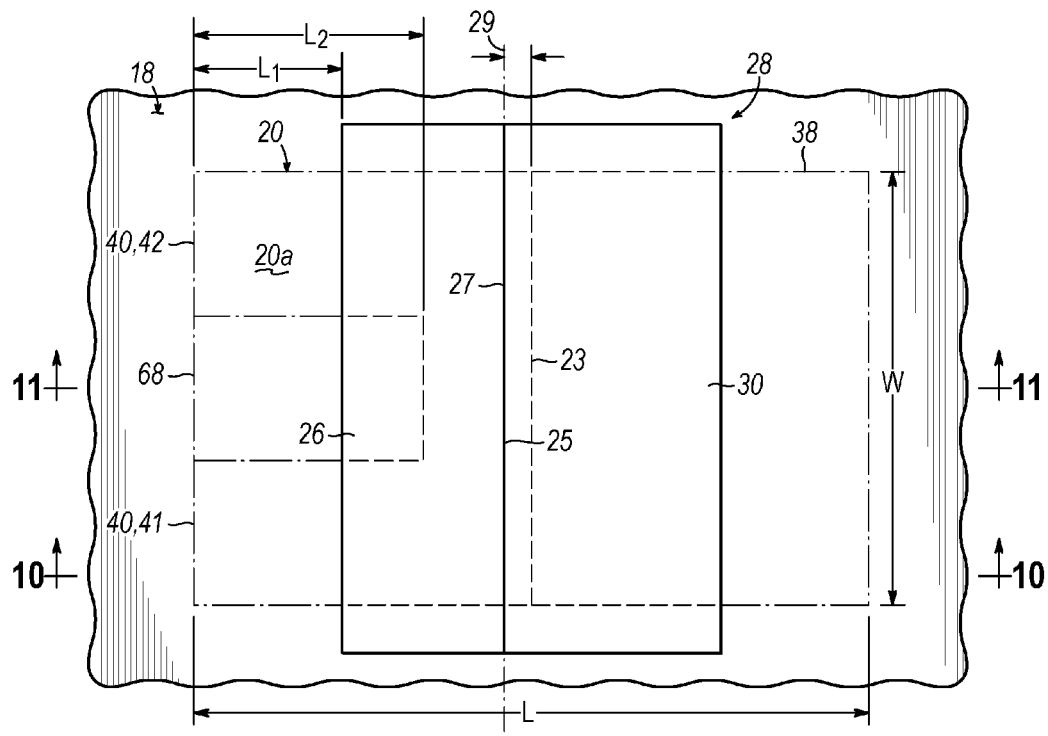
FIG. 9 is a top view similar to FIG. 5 of a self-protected DEMOS transistor in accordance with an alternative embodiment of the invention.
Figure 10:
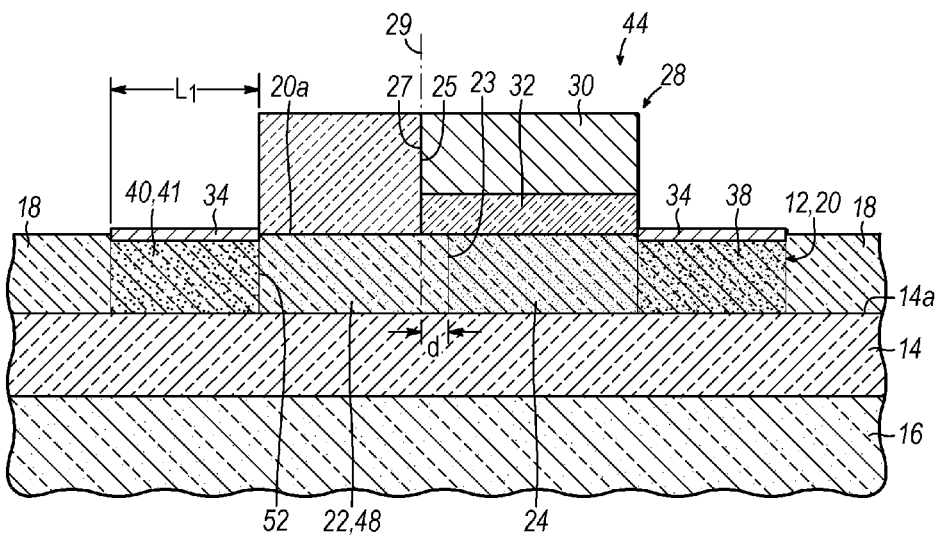
FIG. 10 is a cross-sectional view taken generally along line 10-10 in FIG. 9.
Figure 11:
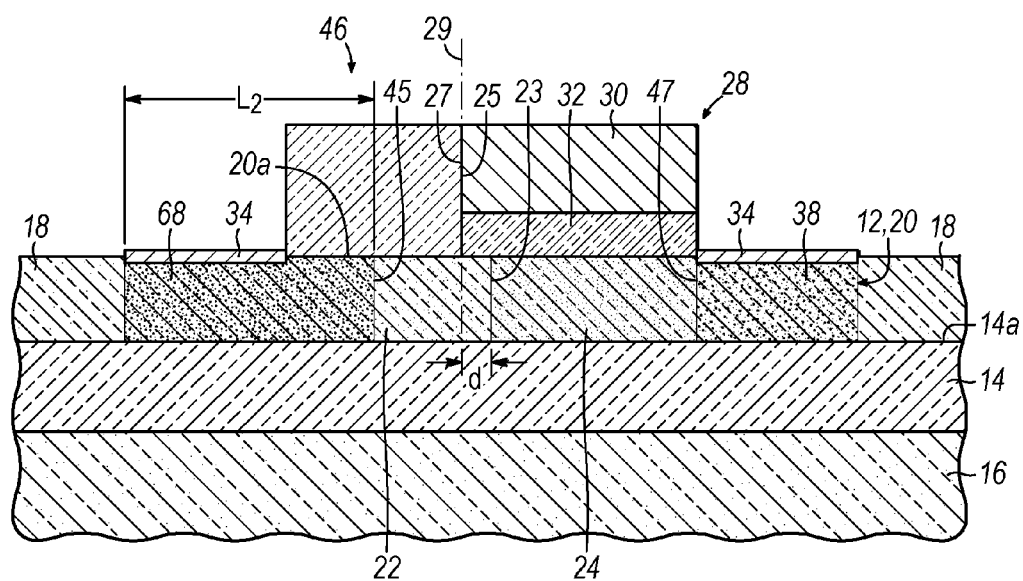
FIG. 11 is a cross-sectional view taken generally along line 11-11 in FIG. 9.

With reference to FIGS. 9-11 in which like reference numerals refer to like features in FIGS. 5-7, a device structure includes the DEMOS transistor 44 and an SCR 66 that is modified in comparison with SCR 46 (FIGS. 5-7). Specifically, the SCR 66 includes a doped region 68 that is similar to doped region 36 but which extends beneath the mask feature 26. In the process flow, the doped region 68 is formed before the mask feature 26 is formed instead of after forming the mask feature 26. The mask alone defines the location of the doped region 68 in the device region 20 and, particularly, the location of the doped region 68 in the well 22 without the benefit of self-alignment by the mask feature 26. The mask feature 26 is applied after the doped region 68 is formed and, as a result, the localization of the doped region 40 in the device region 20 is assisted by the presence of the nonconductive feature over a portion of the well 22. The mask feature 26 partially overlaps the doped region 68 so that the junction 45 is positioned beneath the mask feature 26.

The doped region 68 and the doped region 40 have different dimensions along the length, L, of the device region 20 because the mask feature 26 is absent during the implantation forming doped region 68 and is present during the implantation forming the doped region 40. Specifically, the dimension, $L_1$, of doped region 68 along the length, L, of the device region 20 is greater the dimension, $L_2$, of doped region 40 along the length, L, of the device region 20. The enlarged size of the doped region 68 in comparison with doped region 36 reduces the spacing between the doped region 68 and the well 24, which may function to increase the current gain of the PNP bipolar transistor 46a. The enlarged size also increases the size of the anode of the SCR 66 in comparison with the anode of SCR 46, without significantly altering the DEMOS transistor 44. The junction 45 defined between the doped region 68 and the first well 22 is closer to the junction 23 than the interface 52 between the doped region 40 and the first well 22.

Figure 12:
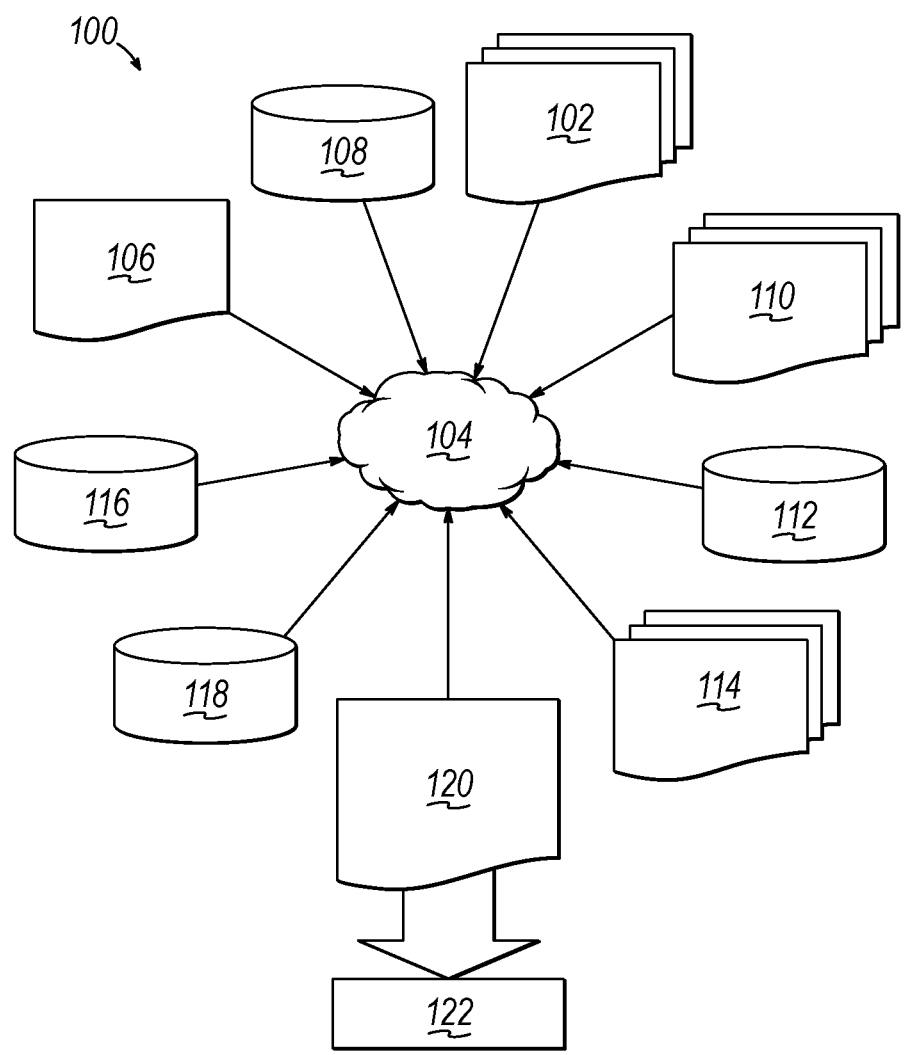
FIG. 12 is a flow diagram of a design process used in semiconductor design, manufacture, and/or test.

FIG. 12 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 5-11. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 5-11. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 7-11 to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 5-11. In one embodiment, design structure 120 may comprise a compiled, executable HDL simulation model that functionally simulates the devices shown in FIGS. 5-11.

Design structure 120 may also employ a data format used for the exchange of layout data of integrated circuits and/or symbolic data format (e.g. information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 5-11. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a device structure, the method comprising:
    forming a first well of a first conductivity type in a device region;
    forming a second well of a second conductivity type in the device region and juxtaposed with the first well to define a p-n junction;
    forming a first doped region of the first conductivity type in the first well;
    forming a second doped region of the first conductivity type in the second well; and
    forming a doped region of the second conductivity type in the first well,
    wherein the first doped region of the first conductivity type is separated from the second well by a first portion of the first well, the doped region of the second conductivity type is separated from the second well by a second portion of the first well, and the second doped region of the first conductivity type is separated from the first portion and the second portion of the first well by a portion of the second well.

2. The method of claim 1 further comprising:
    before the first doped region of the first conductivity type and the doped region of the second conductivity type are formed in the first well, forming a non-conductive feature positioned on a top surface of the device region to overlie the first portion and the second portion of the first well.

3. The method of claim 2 wherein forming the doped region of the second conductivity type in the first well comprises:
    implanting ions of a first dopant into the first well to form the doped region of the second conductivity type; and
    masking the first well with the non-conductive feature while implanting the ions of the first dopant.

4. The method of claim 3 wherein forming the first doped region of the first conductivity type in the first well comprises:
    implanting ions of a second dopant into the first well to form the first doped region of the first conductivity type; and
    masking the first well with the non-conductive feature and the doped region of the second conductivity type with a mask while implanting the ions of the second dopant.

5. The method of claim 4 wherein the ions of the first dopant are implanted into the first well before the ions of the second dopant are implanted into the first well.

6. The method of claim 2 further comprising:
    before forming the second doped region of the first conductivity type in the second well, forming a gate stack positioned on the top surface of the device region to overlie the second well,
    wherein the gate stack is positioned on the top surface of the device region adjacent to the non-conductive feature and overlaps the first well so that the p-n junction is laterally positioned beneath the gate stack.

7. The method of claim 1 further comprising:
    after the first doped region of the second conductivity type is formed in the first well, forming a non-conductive feature positioned on a top surface of the device region to overlie the the first portion and the second portion of the first well.

8. The method of claim 7 wherein the non-conductive feature is formed on a top surface of the device region before the first doped region of the first conductivity type is formed in the first well.

9. The method of claim 1 further comprising:
    forming a plurality of trench isolation regions that define the device region in a device layer of a semiconductor-on-insulator substrate,
    wherein the trench isolation regions extend from a top surface of the device region to a buried insulator layer of the semiconductor-on-insulator substrate.

10. A device structure fabricated using a device region, the device structure comprising:
    a first well of a first conductivity type in the device region;
    a second well of a second conductivity type in the device region and juxtaposed with the first well to define a first p-n junction;
    a first doped region of the first conductivity type in the first well, the first doped region of the first conductivity type separated from the second well by a first portion of the first well;
    a doped region of the second conductivity type in the first well, the doped region of the second conductivity type separated from the second well by a second portion of the first well; and
    a second doped region of the first conductivity type in the second well, the second doped region of the first conductivity type separated from the first portion and the second portion of the first well by a portion of the second well.

11. The device structure of claim 10 wherein the device region has a top surface, and further comprising:
    a non-conductive feature on the top surface of the device region, the non-conductive feature positioned to overlie the first portion and the second portion of the first well.

12. The device structure of claim 10 further comprising:
    a gate stack on the top surface of the device region, the gate stack positioned to overlie the second well,
    wherein the gate stack is positioned on the top surface of the device region adjacent to the non-conductive feature and overlaps the first well so that the first p-n junction is laterally positioned beneath the gate stack.

13. The device structure of claim 10 wherein the doped region of the second conductivity type and the second portion of the first well define a second p-n junction, the first doped region of the first conductivity type and the second portion of the first well adjoin along an interface, and the second p-n junction is closer to the first p-n junction than the interface.

14. The device structure of claim 10 wherein the doped region of the second conductivity type and the second portion of the first well define a second p-n junction, the first doped region of the first conductivity type and the second portion of the first well adjoin along an interface, and the second p-n junction and the interface are equal distances from the first p-n junction.

15. The device structure of claim 10 wherein the first doped region of the first conductivity type includes a first section and a second section, and the doped region of the second conductivity type is positioned between the first section and the second section.

16. The device structure of claim 15 wherein the first section and the second section of the first doped region of the first conductivity type are equal in size.

17. The device structure of claim 10 wherein the doped region of the second conductivity type defines an anode of a silicon controlled rectifier (SCR), the first doped region of the first conductivity type defines a drain of a drain-extended metal-oxide-semiconductor (DEMOS) transistor, the first portion of the first well defines an extended drain of the DEMOS transistor, and the second doped region of the first conductivity type defines a source of the DEMOS transistor and a cathode of the SCR.

18. The device structure of claim 17 wherein the doped region of the second conductivity type defines a second junction with the second portion of the first well, and the second well defines a third junction with the second doped region of the first conductivity type.

19. The device structure of claim 10 further comprising:
a plurality of trench isolation regions that define the device region in a device layer of a semiconductor-on-insulator substrate, the trench isolation regions extending from a top surface of the device region to a buried insulator layer of the semiconductor-on-insulator substrate.

20. A design structure readable by a machine used in design, manufacture, or simulation of an integrated circuit, the design structure comprising:
a first well of a first conductivity type in the device region;
a second well of a second conductivity type in the device region and juxtaposed with the first well to define a first p-n junction;
a first doped region of the first conductivity type in the first well, the first doped region of the first conductivity type separated from the second well by a first portion of the first well;
a doped region of the second conductivity type in the first well, the doped region of the second conductivity type separated from the second well by a second portion of the first well; and
a second doped region of the first conductivity type in the second well, the second doped region of the first conductivity type separated from the first portion and the second portion of the first well by a portion of the second well.

* * * * *